(12) United States Patent
Yip et al.

(10) Patent No.: US 8,092,645 B2
(45) Date of Patent: Jan. 10, 2012

(54) CONTROL AND MONITORING SYSTEM FOR THIN DIE DETACHMENT AND PICK-UP

(75) Inventors: Siu Ping Yip, Kwai Chung (HK); Chi Ming Chong, Kwai Chung (HK); Man Wai Chan, Kwai Chung (HK); Kwok Wai Wong, Kwai Chung (HK)

(73) Assignee: ASM Assembly Automation Ltd, Hong Kong (HK)

( * ) Notice: Subject to any disclaimer, the term of this patent is extended or adjusted under 35 U.S.C. 154(b) by 0 days.

(21) Appl. No.: 12/701,065

(22) Filed: Feb. 5, 2010

(65) Prior Publication Data

US 2011/0192547 A1  Aug. 11, 2011

(51) Int. Cl.
*B32B 38/10* (2006.01)

(52) U.S. Cl. ........ 156/714; 156/707; 156/709; 156/719; 156/758; 156/764; 156/766; 156/767; 156/931; 156/932; 156/941; 156/943

(58) Field of Classification Search .......... 156/707, 156/709, 714, 719, 758, 764, 766, 767, 931, 156/932, 941, 943
See application file for complete search history.

(56) References Cited

U.S. PATENT DOCUMENTS

| | | | | |
|---|---|---|---|---|
| 6,165,310 A * | 12/2000 | Freund et al. | .......... | 156/344 |
| 6,709,543 B2 * | 3/2004 | Kurosawa | .......... | 156/344 |
| 6,824,643 B2 * | 11/2004 | Yoshimoto et al. | .......... | 156/344 |
| 7,240,422 B2 * | 7/2007 | Cheung et al. | .......... | 29/762 |
| 2003/0077854 A1 * | 4/2003 | Teshirogi et al. | .......... | 438/113 |
| 2004/0238112 A1 * | 12/2004 | Cheung et al. | .......... | 156/285 |
| 2007/0103657 A1 * | 5/2007 | Yoshitake et al. | .......... | 355/52 |
| 2009/0301579 A1 * | 12/2009 | Wong et al. | .......... | 137/489 |

FOREIGN PATENT DOCUMENTS

JP      2001118862 A  *  4/2001

* cited by examiner

*Primary Examiner* — Philip Tucker
*Assistant Examiner* — Nickolas Harm
(74) *Attorney, Agent, or Firm* — Ostrolenk Faber LLP

(57) ABSTRACT

During detachment of a die from an adhesive tape, the inner and outer portions of a first side of the die which is in contact with the adhesive tape is supported with a support surface. A collet contacts the inner and outer portions of a second side of the die opposite to the first side. Support is withdrawn from the outer portion of the die such that the outer portion of the second side of the die bends away from the collet while the support surface only supports the inner portion of the die. Vacuum suction from the collet is applied to attract the outer portion of the die towards the collet and the vacuum suction pressure is monitored until a threshold pressure is reached indicating that the outer portion of the die is contacting the collet. Thereafter, the collet is lifted while holding the die with vacuum suction to completely separate the die from the adhesive tape.

13 Claims, 6 Drawing Sheets

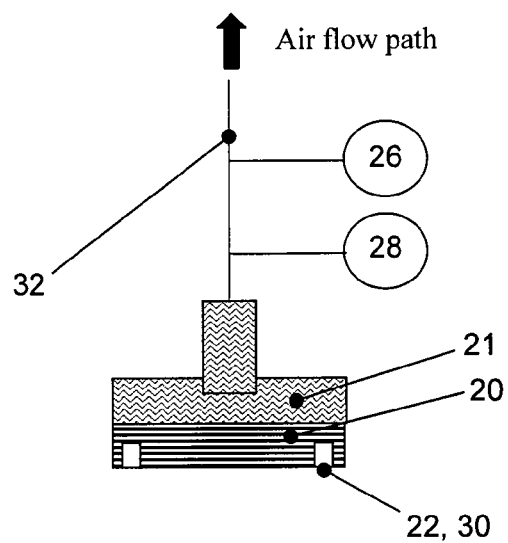
FIG. 6
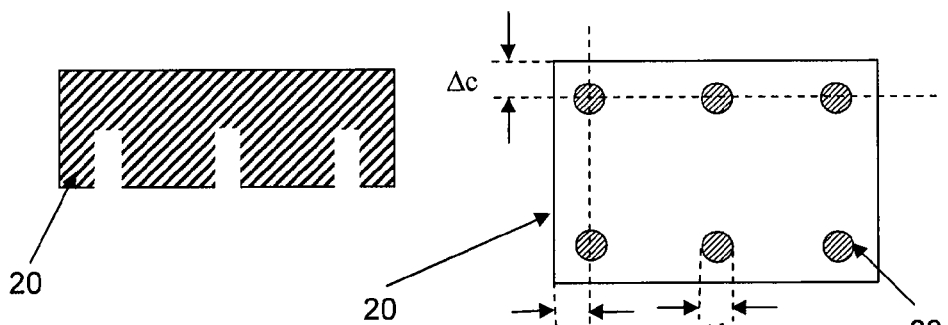
FIG. 7A
FIG. 7B
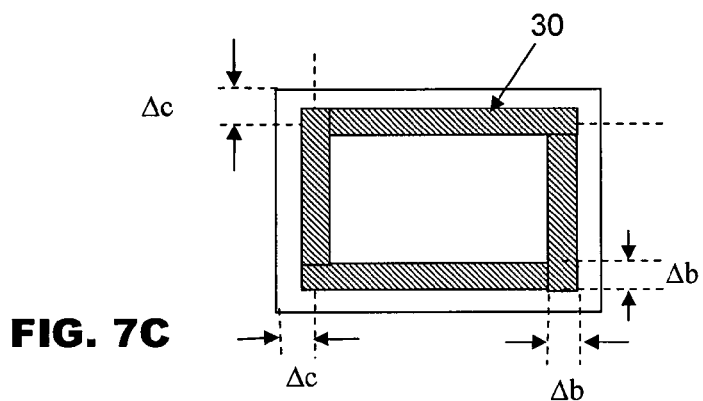
FIG. 7C

CONTROL AND MONITORING SYSTEM FOR THIN DIE DETACHMENT AND PICK-UP

FIELD OF THE INVENTION

The invention relates to the handling of a semiconductor chip or semiconductor die during semiconductor assembly and packaging, and in particular to a feedback control system to provide controlled delamination of a semiconductor die from an adhesive tape on which it is mounted during the detachment and pick-up of the semiconductor die.

BACKGROUND AND PRIOR ART

Typically, a wafer comprising a plurality of semiconductor dice is mounted on an adhesive tape during singulation wherein each individual die is separated while it adheres to the adhesive tape. Detaching and picking up of a die from an adhesive tape is thus an important operation in die bonding and flip chip bonding processes for assembling electronic packages.

It is a challenging task to detach a die from an adhesive tape without damaging the die when the thickness of the die is reduced to below 4 mils (about 100 microns). Dice with thicknesses of 50-100 microns have been used for mass production for some time. Mass production of dice at 30-50 microns thick is currently under preparation. Experiments for research and development in electronic packaging designs are ongoing for dice of 15-30 microns thick. Hence, an apparatus that is capable of reliably detaching very thin dice from adhesive tapes is becoming a critical machine in the realm of electronic assembly equipment.

Typically in a die bonding process, a die is detached and picked up from an adhesive tape by ejection and pick-up tools before the die is transferred to a substrate such as a lead frame, a printed wiring board (PWB) substrate or a surface of another die in stacking die applications. In a die pick-up process, a designated die on an adhesive tape is aligned with an ejection tool with push-up pins which raises the die from the underside while the adhesive tape is held down by vacuum suction. A collet or a pick-up tool is then positioned just above the top surface of the partially detached die while the die is being lifted from the adhesive tape when the push-up pins rise to an appropriate level. The collet provides vacuum suction using a vacuum generator to hold the die during the detachment process, as well as transfers the detached die from the adhesive tape to a bonding substrate.

There are various forms of die detachment and pick-up tools for facilitating detachment of a die from an adhesive tape to which it is mounted. The conventional tools include a needle-type ejector pin design, which is a traditional design for detaching a small die from an adhesive tape. FIG. 1 is an illustration of a conventional die detachment and pick-up tool 100 with needle-type ejector pins 102. The die detachment part of the tool 100 has an ejector comprising an ejector chuck 104, ejector pins 102 and an ejector cap 106. The pick-up part of the tool 100 has a collet 108 positioned above a die 110 located on an adhesive tape 112 which is in contact with an upper platform surface 107 of the ejector cap 106. Vertical movement of the ejector chuck 104 is driven by a motorised mechanism. The ejector pins 102 are positioned on top of the ejector chuck 104 and are movable with the ejector chuck 104. For small dice of dimensions such as 2×2 mm², a single ejector pin 102 positioned at the center of the die 110 to be detached suffices to detach the die 110. Multiple ejector pins 102 are preferred for larger dice, and the ejector pins 102 are evenly distributed to achieve a uniform push-up force on the die 110 so as to reduce a pinching effect by the ejector pins 102. The ejector chuck 104 and ejector pin/pins 102 are positioned within the ejector cap 106. A vacuum channel 114 is enclosed by the ejector cap 106 in order to provide vacuum suction to the adhesive tape 112 for aiding in the delamination of the die 110 to pull the adhesive tape 112 in a direction away from the collet 108.

When the thickness of a die is reduced to less than 100 microns, the die becomes less rigid. To detach a die, peeling energy is applied to the die being detached via push-up motion of ejector pins and the vacuum suction on the adhesive tape in order to overcome a critical interfacial adhesion strength between the die and an adhesive tape. Deformation of the die may arise due to the pinching effect by the ejector pins and the bending of the die. When the applied peeling energy reaches the critical interfacial adhesion strength, the die may be detached from the adhesive tape. However, the die will crack or break when the process of deformation of the die also reaches the critical strength of the die. The critical strength of the die depends on various characteristics of the die, such as the material of the die, wafer thinning, pattern on the surface of die and sawing of the die. For conventional die pick-up using ejector pin or pins, the pinching effect and bending deformation are affected by the number, arrangement and geometry of the ejector pins. Furthermore, for a large die, the ejector pins located at the periphery of the die inhibit propagation of the detachment to the center of die. Therefore, a conventional pick-up tool using ejector pins may not be suitable for detaching a thin die from an adhesive tape.

FIG. 2 illustrates a die detachment and pick-up tool 10 which is configured for detaching a thin die 12 from an adhesive tape 18 on which the die 12 is mounted. The die 12 is supported by a plurality of vertically movable supporting plates 14 which are located within an ejector cap 16. Each plate 14 has a quadrilateral-shaped contact surface and is arranged adjacent to other similar plates 14. The plates 14 comprise a central movable supporting plate and outer movable supporting plates on opposite sides of the central movable supporting plate which together form a continuous and flat quadrilateral-shaped contact surface for supporting the die 12 on the adhesive tape 18. Each plate 14 is movable relative to the other movable supporting plates towards and away from the die 12. The tool 10 is a useful pick-up device for thin dice as it provides support and reduces the pinching effect from sharp projections pushing onto the die 12.

During the initial detachment of the die 12, maximum support provided to the die 12 avoids substantial deformation to the die 12 while it is being detached from the adhesive tape 18. A collet 20 which is connected to a bondhead is positioned above the die 12. The collet 20 contacts the die 12 and pulls the die 12 towards the collet by vacuum suction from the collet. Thus, the collet 20 holds the die 12 in place by the vacuum suction while it is being detached. After the die 12 is detached, the collet 20 is lifted completely to separate the die from the adhesive tape 18 and transports the detached die 12 away from the adhesive tape.

To achieve an optimal die detachment process and to prevent cracking the die 12, it would be desirable to provide a control system which assesses the peeling energy experienced by the die 12 by virtue of the projecting motion of the movable supporting plates 14 so that the peeling energy will not exceed the critical strength of the die 12. This is especially helpful for handling thin dice which are less rigid and therefore crack more easily.

SUMMARY OF THE INVENTION

It is thus an object of the invention to seek to provide a real time monitoring and control system for the detachment of a thin semiconductor chip from an adhesive tape.

Accordingly, the invention provides a method for detaching a die from an adhesive tape on which the die is mounted, comprising the steps of supporting with a support surface inner and outer portions of a first side of the die which is in contact with the adhesive tape; contacting the inner and outer portions of a second side of the die opposite to the first side with a collet; withdrawing support from the outer portion of the die such that the outer portion of the second side of the die bends away from the collet while the support surface only supports the inner portion of the die; applying vacuum suction from the collet to attract the outer portion of the die towards the collet and monitoring the vacuum suction pressure until a threshold pressure is reached indicating that the outer portion of the die is contacting the collet; and thereafter lifting the collet while the collet is holding the die with vacuum suction to completely separate the die from the adhesive tape.

It would be convenient hereinafter to describe the invention in greater detail by reference to the accompanying drawings which illustrate one preferred embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which:

FIG. 6 is a schematic drawing illustrating a feedback system connected to the die detachment and pick-up tool of FIG. 2 according to the preferred embodiment of the invention;

FIGS. 7A to 7C are schematic drawings illustrating an exemplary arrangement of vacuum suction holes and vacuum channels in a collet incorporating the feedback system according to the preferred embodiment of the invention.

DETAILED DESCRIPTION OF THE PREFERRED EMBODIMENT OF THE INVENTION

The preferred embodiment of the invention will hereinafter be described with reference to the accompanying drawings.

Figure 1:
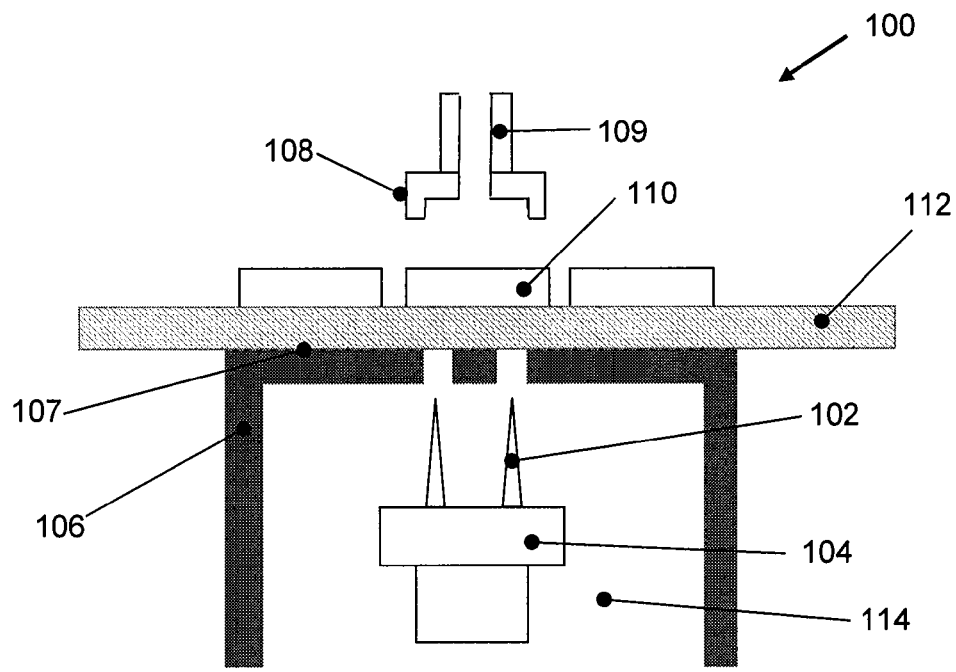
FIG. 1 is an illustration of a conventional die detachment and pick-up tool with needle-type ejector pins.
Figure 2:
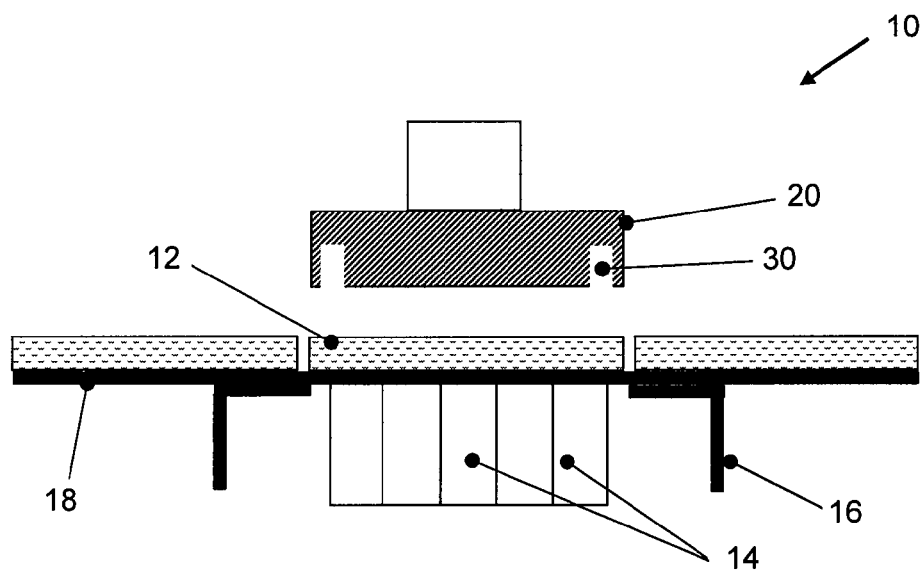
FIG. 2 illustrates a die detachment and pick-up tool which is configured for detaching a thin die.
Figure 3A:
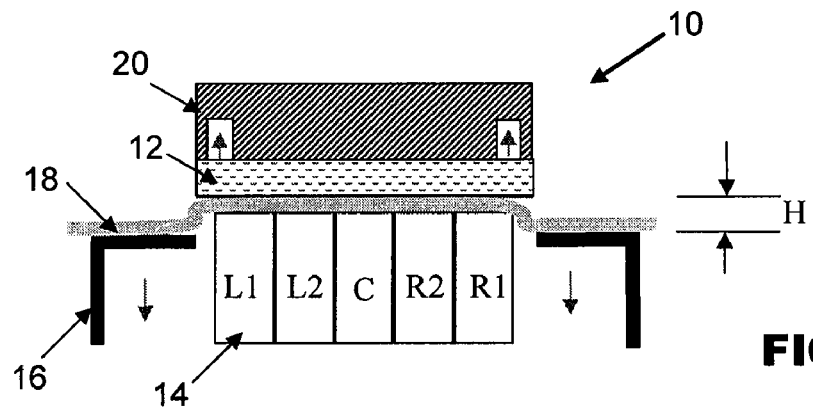
FIGS. 3A to 3C illustrate a pick-up sequence for a die using the die detachment and pick-up tool of FIG. 2.
Figure 3B:
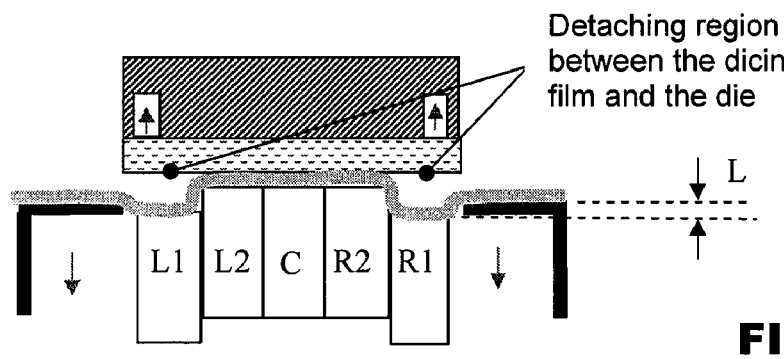
Figure 3C:
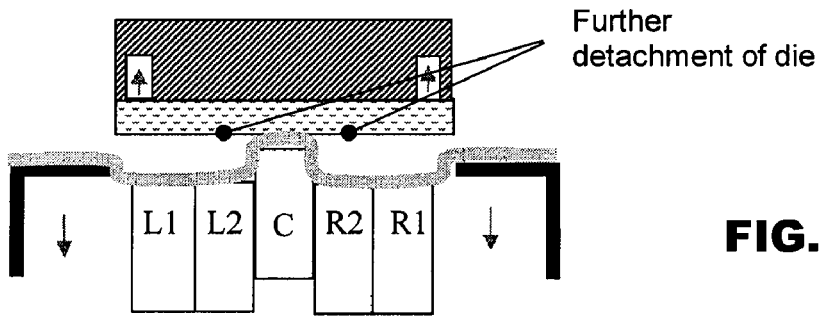

FIGS. 3A to 3C illustrate a pick-up sequence for a die 12 using the die detachment and pick-up tool 10 of FIG. 2. The die 12 has been aligned to the center of the ejector cap 16 and the collet 20 has moved to contact a surface of the die 12. Vacuum suction is applied within the ejector cap 16 and the collet 20 to hold the adhesive tape 18 supporting the die 12. All the movable supporting plates 14 are moved to a pre-peeling level, H, as shown in FIG. 3A where initial die detachment occurs at the edge of the die 12. The movable supporting plates 14 comprises a center plate C and at least one pair of outer plates L2R2 located on opposite sides of the center plate arranged adjacent to one another to form a continuous surface to support inner and outer portions of the die 12. Each pair of outer plates L1R1, L2R2 is independently movable towards or away from the die 12 by incremental sub-intervals towards the pre-peeling level H at which the die 12 is supported during die detachment.

After all the moveable supporting plates 14 have moved to the pre-peeling level, support is gradually withdrawn from the outer portion of the die 12 by sequentially lowering each pair of outer plates relative to the center plate C from an outermost pair of plates towards the center plate one pair at a time. This is illustrated in FIGS. 3B and 3C where the outermost plates R1 and L1 located at opposite ends move down to a level L below the surface of the ejector cap 16. Next, sequential lowering of a pair of the outermost plates R2 and L2 adjacent to the plates R1 and L1 continues as shown in FIG. 3C until all the plates 14 have moved down away from the die 12. Finally, the die 12 is detached from the adhesive tape 18 when most of the adhesive tape 18 has separated from the die 12.

Figure 4A:
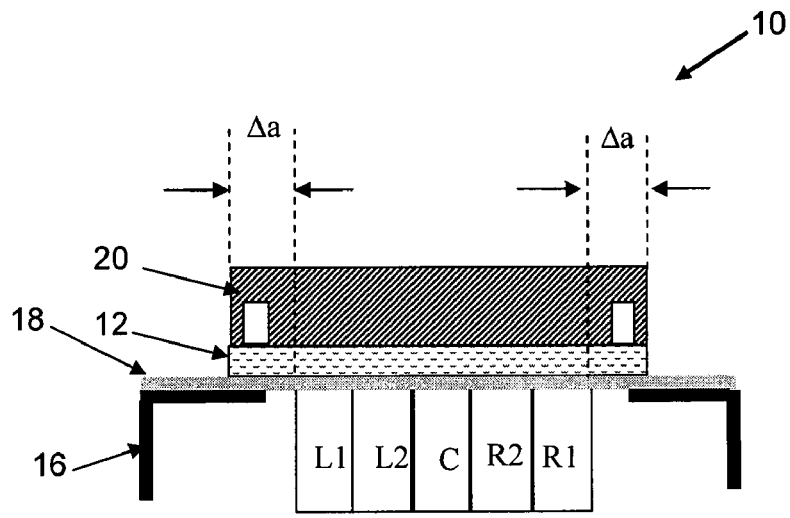
FIGS. 4A to 4D illustrate a pre-peeling phase of a die detachment process using the die detachment and pick-up tool of FIG. 2.
Figure 4B:
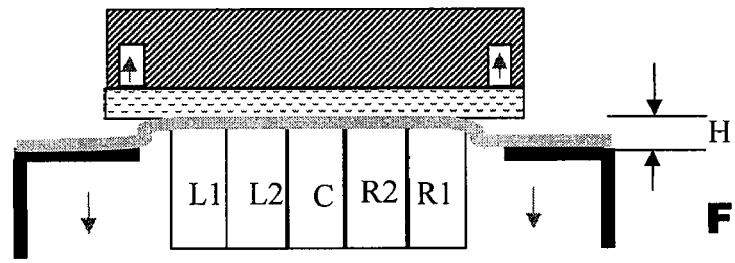

FIGS. 4A to 4D illustrate a pre-peeling phase of a die detachment process using the die detachment and pick-up tool 10 of FIG. 2. All the movable supporting plates 14 are moved to the pre-peeling level H relative to the ejector cap 16 and vacuum suction is applied in both the collet 20 and the ejector cap 16 as shown in FIG. 4B. The die 12 is positioned on the ejector cap 16 and its inner and outer portions are supported by the movable supporting plates 14 on a first side of the die 12 which is in contact with the adhesive tape 18. The collet 20 supports and contacts the inner and outer portions of a second side of the die 12 opposite to the first side while pulling the die 12 towards the collet 20 by vacuum suction.

A cantilever gap of $\Delta a$ extends along the first side of the die 12 that is unsupported as shown in FIG. 4A. The cantilever gap $\Delta a$ corresponds to the distance between an edge of the die 12 and the corresponding edge of the movable supporting plates 14 combined where the distance $\Delta a$ is in the range of 0.3 mm to 0.8 mm. The exact distance $\Delta a$ can be calculated based on the critical strength and the thickness of the die 12.

Figure 4C:
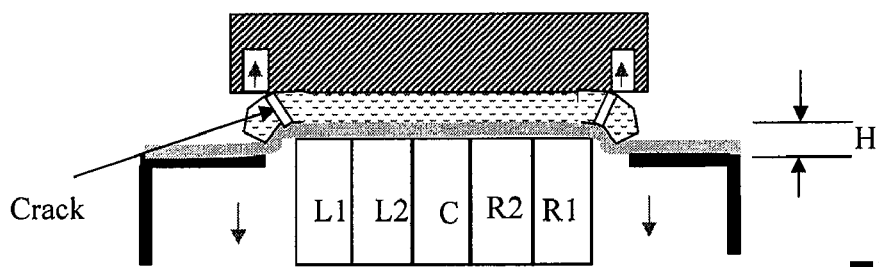

When the peeling energy applied to the die 12 is higher than the critical interfacial adhesion strength between the die 12 and the adhesive tape 18 and the deformation of the die 12 is less than the critical strength of the die 12, the die 12 will be detached from the adhesive tape 18. Delamination of the die 12 enables the second surface of the die 12 to be held in contact with the collet 20 by vacuum suction from the collet 20 as in FIG. 4B. On the other hand, when the peeling energy applied to the die 12 is less than the critical interfacial adhesion strength and the deformation of the die 12 is higher than the critical strength of the die 12, the die 12 will crack as illustrated in FIG. 4C. This indicates that the pre-peeling level H is too high. Hence to avoid cracking of the die 12, it is important to move all the movable supporting plates 14 to a lower pre-peeling level H.

In order to increase the peeling energy applied to the die 12, the distance $\Delta a$ may be increased. Design optimization to obtain a suitable value for $\Delta a$ is based on the relationship of the peeling energy and the distance $\Delta a$ whereby the peeling energy increases with an increase in the value of $\Delta a$. The distance $\Delta a$, thickness of the die and the critical interfacial adhesion strength of the die are all related. Hence, when the value of $\Delta a$ is optimized and yet a higher pre-peeling level is required, the die can be detached by dividing the pre-peeling level H into sub-intervals that are smaller than H in order to determine whether there is die detachment when all the movable supporting plates 14 have moved up to each sub-interval.

Incorporating an active feedback system to the collet 20 according to the preferred embodiment of the invention enables one to check whether a threshold pressure is reached which will indicate whether the die 12 has been detached at each sub-interval and/or at the pre-peeling level H. The vacuum channels 30 should be located on the surface of the collet 20 and near the edge of the die 12 to detect whether the die 12 has been detached from the adhesive tape 18. Vacuum or air flow at the collet 20 when the die 12 is bent and not detached from the adhesive tape 18 is different compared to when the die 12 is detached and not bent. Hence, monitoring the vacuum flow will disclose the state of the die 12.

Figure 4D:
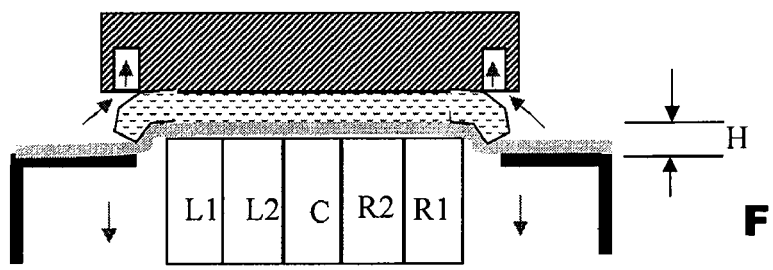

FIG. 4D shows the bending of a die 12 when the peeling energy applied on the die 12 is less than the critical interfacial adhesion strength and the deformation in the die 12 is less than the critical die strength. This could be because the adhesive tape 18 is made of a material which exhibits a time-dependent behaviour. Therefore, some delay time may be needed before the peeling energy applied on the die 12 may overcome the critical interfacial adhesion strength of the die 12. At this phase, it is necessary to determine whether the die 12 has been detached otherwise the critical die strength may be exceeded, and this may stress and crack the die 12. A die pick-up delay time is automatically included by the feedback system of the preferred embodiment to avoid prematurely picking up a die when the peeling energy applied on the die is less than the critical interfacial adhesion strength.

The working principle of the feedback system of the preferred embodiment is now described. Since the center region of the die 12 is supported by the continuous top surface of the movable supporting plates 14, the difference in vacuum or suction flow is due to whether the edge of the die 12 bends and is spaced from the vacuum suction holes 22 in the collet 20. In turn this corresponds to whether the die 12 has detached from the adhesive tape 18. There is a geometrical relationship between the degree of bending of a die and the vacuum or suction flow detected as a result of the bending. In order to have a reliable geometrical relationship, the bending stiffness of the die should be kept sufficiently low. The bending stiffness of the die is proportional to the thickness of the die and in the preferred embodiment of this present invention, the upper bound of the thickness of the die 12 is preferably equal to or less than 75 microns (3 mils). Another parameter to consider is the arrangement of vacuum suction holes 22 in the collet 20 which is described below.

FIGS. 5A to 5D illustrate subsequent die detachment phases after the pre-peeling phase during which the die 12 has still not been fully detached. Vacuum or flow detection during the die detachment process using the feedback system of the preferred embodiment may be further applied during a sequential lowering of the movable supporting plates 14 from the outermost pair to the center plate C.

Figure 5A:
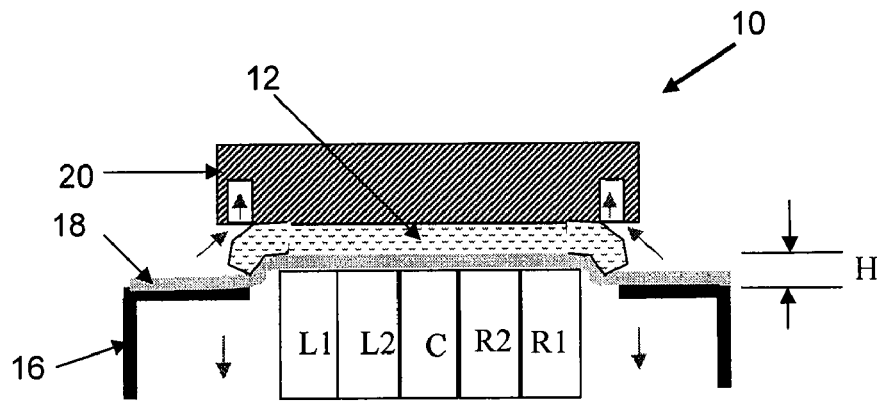
FIGS. 5A to 5D illustrate subsequent die detachment phases after the pre-peeling phase during which the die has still not been fully detached.
Figure 5B:
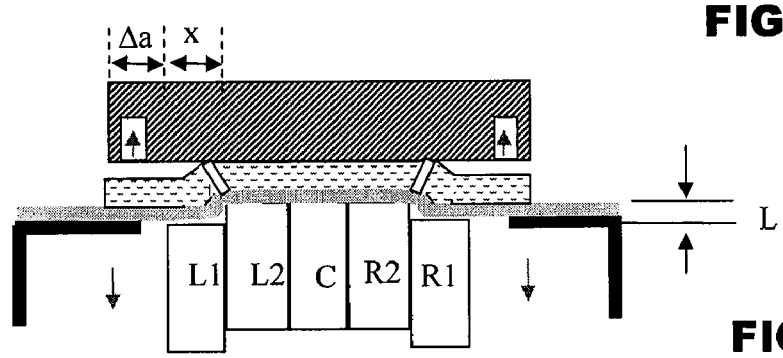
Figure 5C:
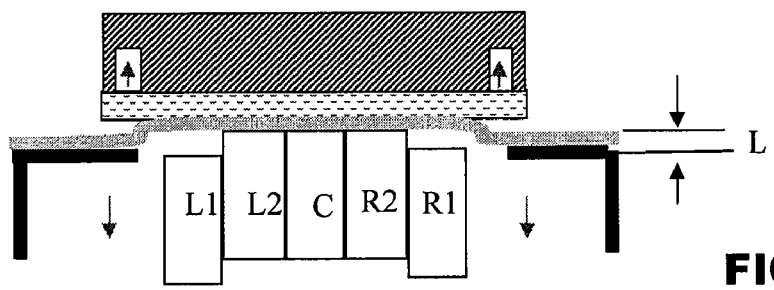

FIG. 5A shows that most of the die 12 has not been detached at the pre-peeling phase. FIG. 5B shows a first pair of outermost movable supporting plates L1 and R1 have moved down to a level L below the surface of the other supporting plates and created an increase in the cantilever length from $\Delta a$ to $\Delta a+x$, where x is a width of the plate 14. This causes the outer portion of a second side of the die 12 which is opposite to the first side to bend away from the collet 20 while the movable supporting plates 14 only supports the inner portion of the die 12. As a result, the die 12 will crack since the die 12 has not been detached from the adhesive tape 18 at the pre-peeling phase. If the die 12 has been detached during the pre-peeling phase as in FIG. 5C, moving the plates L1 and R1 down away from the adhesive tape 18 will not cause the die 12 to crack. Hence, it is essential to determine whether unsupported areas of the die 12 have detached from the adhesive tape 18 before moving down any other supporting plates 14 to a level below the surface of other supporting plates using the feedback system of preferred embodiment of the invention.

Figure 5D:
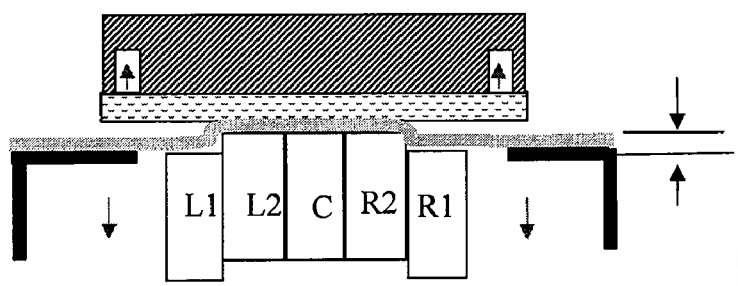

An optimized value for the width x of the movable supporting plate 14 is useful for detaching a die without cracking the die 12. The width x varies with the thickness of a die and optimization can be achieved using the vacuum or flow sensor 28 of the preferred embodiment. FIG. 5D shows unsupported areas of the die 12 being detached when the pair of end movable plates L1 and R1 move down. If the die 12 is not detached during the movement of the plates L1 and R1 downwards, one can ensure that the die 12 will not crack when the width x of the movable supporting plates 14 is optimized. Therefore, the feedback system is devised such that before moving another plate 14 downwards, the vacuum or flow detection sensor will determine whether there has been any die detachment in the previous step. This feedback system prevents a die from cracking when the sequential pairs of movable supporting plates 14 are lowered to level L.

FIG. 6 is a schematic drawing illustrating the feedback system connected to the die detachment and pick-up tool 10 of FIG. 2 according to the preferred embodiment of the invention. The feedback system comprises the vacuum generator 26 or an inline vacuum source and a vacuum or flow detection device comprising a flow detection sensor 28. The vacuum generator 26 generates vacuum suction or an air flow in the collet 20. The collet 20 has a collet shaft 21 extending away from a surface of the collet 20 and there are vacuum channels 30 located within the collet shaft 21. The vacuum or flow sensor 28 is connected to the vacuum channels 30 and collet connecting pipes 32 and is hence incorporated in the path of the air flow which passes from the collet 20 through the vacuum channels 30 in the die detachment process. Further, the collet 20 comprises vacuum suction holes 22 located on the surface of the collet 20 leading to the vacuum channels 30. The said surface of the collet 20 is in contact with the die 12. The arrangement of the vacuum suction holes 22 and the vacuum channels 30 may be determined by the desired feedback system of the preferred embodiment of the invention.

By detecting the vacuum or air flow in the vacuum channels 30, one may determine whether unsupported areas of a die 12 have been detached either at the pre-peeling phase or at each sequential lowering of end pairs of movable supporting plates 14. When the die 12 is detached from the adhesive tape 18, the die 12 conforms to the surface of the collet 20 with which it is in contact and the vacuum pressure is higher. When the die 12 remains attached to the adhesive tape 18, the die 12 will bend and vacuum pressure would be lower. Thus, the feedback system provides closed-loop feedback control for detaching a die from an adhesive tape 18. If vacuum or air flow is formed at a certain threshold level, it means that a die has been detached. If the die has not yet been detached, more time is needed for the process of die detachment. This active feedback system will therefore ensure that the threshold pressure is reached before lowering a next adjacent pair of outer plates relative to the center plate C. In this way, the feedback system optimizes the time taken for picking up a thin die. For example, a less sticky adhesive tape 18 will require a shorter pick-up time.

FIGS. 7A to 7C are schematic drawings illustrating an exemplary arrangement of vacuum suction holes 22 and vacuum channels 30 in a collet 20 incorporating the feedback system according to the preferred embodiment of the invention. Detachment of a die starts from an edge of the die and is subject to the constraints of the distances $\Delta a$ and x. The number and arrangement of the vacuum suction holes 22 or vacuum channels 30 in the collet 20 also affect the detachment of a die. One arrangement of the vacuum suction holes or channels on the surface of a collet is illustrated in a cross-sectional side view of the collet 20 shown in FIG. 7A and a bottom view of the collet 20 in FIG. 7B. The vacuum suction holes 22 and the vacuum channels 30 are provided on the outer portion of the collet 20 near its edges such that the vacuum suction holes 22 are preferably located near the outer portion or the four edges of the die 12. In this way, it is possible to monitor contact between the outer portion of the die 12 and the corresponding outer portion of the collet 20. The diameter of the vacuum suction hole 22, which may correspond to the width of the vacuum channel, $\Delta b$, is preferably within the range 0.3 mm to 1 mm. The distance from the center of the vacuum suction hole 22 or vacuum channel 30 to the edge of the die 12, $\Delta c$, is preferably in the range 0.6 mm to 2 mm. A top view of the interconnecting vacuum channels 30 in the collet 20 is also illustrated in FIG. 7C.

Figure 8:
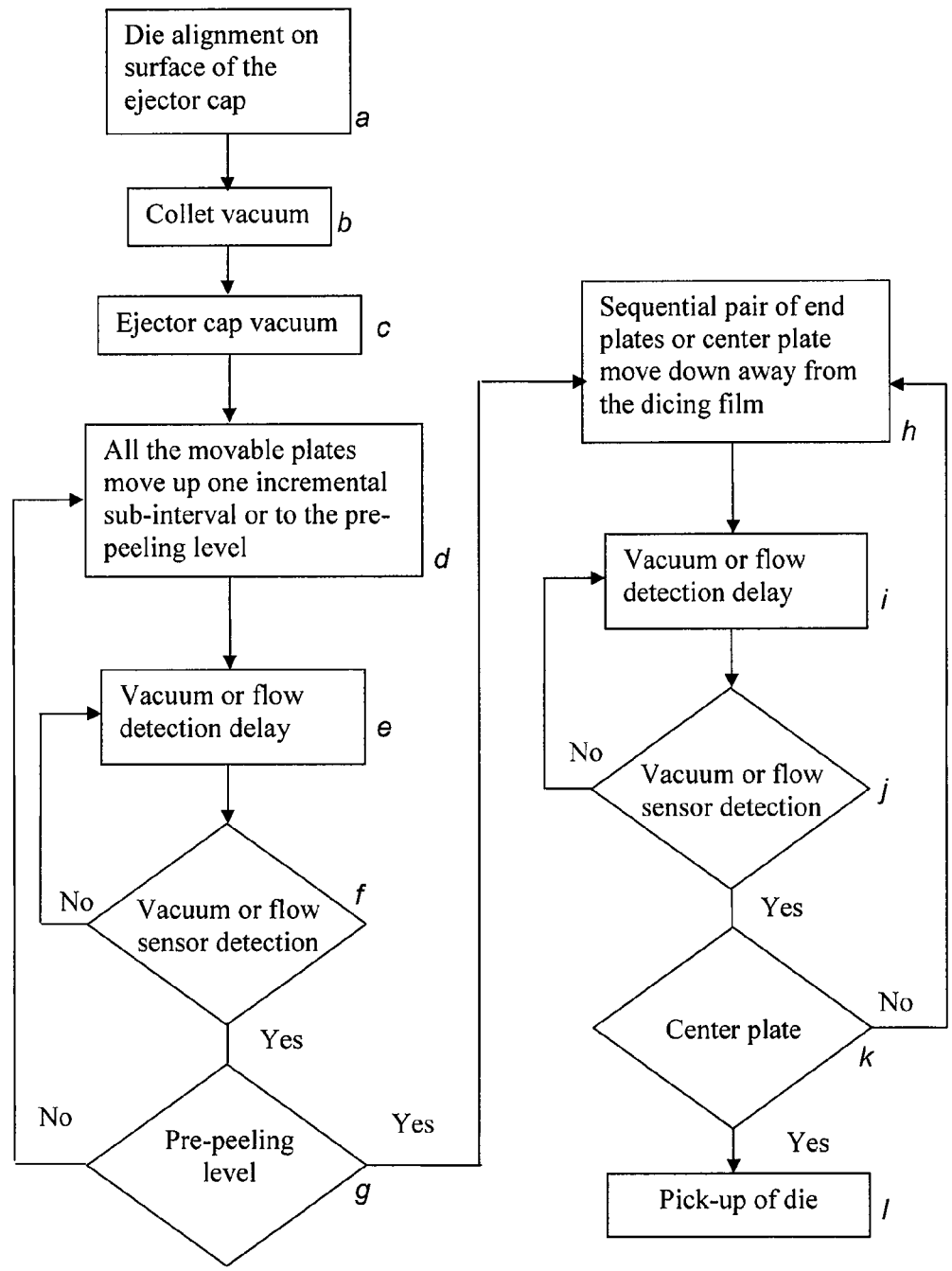
FIG. 8 is a flow chart illustrating an operation sequence of the feedback system according to the preferred embodiment of the invention.

FIG. 8 is a flow chart illustrating an operation sequence of the feedback system according to the preferred embodiment of the invention. The feedback operation comprises an active sequence for detaching a thin die 12 using the vacuum or a flow sensor 28 incorporated into the die detachment and pick-up tool 10 of FIG. 2. After the die 12 is aligned on the surface of an ejector cap 16 at step a, vacuum suction is applied to both the collet 20 and the ejector cap 16 (steps b and c). The operation of detaching the die 12 may involve moving all the movable supporting plates 14 to the pre-peeling level H or to the incremental sub-intervals towards H (step d).

When the plates 14 are at the pre-peeling level H or at each incremental sub-interval, vacuum or flow sensor detection is carried out (step f) after providing a delay time allowing for a vacuum or flow detection delay (step e) for the peeling energy to act on the die 12 before detecting whether the threshold pressure is reached for detaching the die 12 from the adhesive tape 18. If the vacuum sensor 28 detects vacuum suction on the die, the die has been detached at the pre-peeling level (steps f and g). More plates 14 may be lowered to the next sub-interval level (step d) or the vacuum delay time may be increased to allow for the peeling energy applied on the die to act sufficiently to overcome the critical interfacial adhesion strength between the die and the adhesive tape 18 in order to detach the die 12. The detection process is repeated till all the plates 14 ending with the center plate C are lowered while avoiding die crack. The die 12 is then detached completely from the adhesive tape 18 and is picked up by the collet 20 (step I).

For each upward movement of all the plates 14 to a sub-interval or a downward movement of a pair of end plates 14, the vacuum or flow sensor 28 is activated to determine whether the die 12 has detached from the adhesive tape 18. When the die 12 has been detached and closes the vacuum suction holes 22, the outer portions of the die 12 are pulled onto the surface of the collet 20. At this stage, vacuum suction or an air flow forms beyond a certain threshold level. When more time is required for detaching the die 12, a delay is provided before activating the vacuum or flow sensor to determine whether the die 12 is detached. Steps e and f and steps i and j will therefore be repeated. This active feedback system will optimize the time for picking up a thin die. For example, for a less sticky adhesive tape, less time is required to pick up a die.

It should be appreciated that a die detachment and pick-up tool using sequentially movable supporting elements that incorporates the active feedback system of the preferred embodiment of the invention allows for the detachment of thin dice with reduced incidences of die cracking during die detachment and pick-up. A real time monitoring system is provided which monitors and controls the stress applied on a thin die so that the yield during detachment of a die may increase without cracking the die. This is achieved by optimizing the distance $\Delta a$ and a width of the movable supporting plate x to achieve swift detachment of the die at the pre-peeling phase and the sequential phases of moving down of pairs of end plates until all the movable supporting plates have been moved down. The feedback system also includes an automatic delay period for picking-up a die to allow the peeling energy to act on the die 12 so as to overcome the critical interfacial adhesion strength.

The active feedback system of the preferred embodiment assesses and monitors the die detachment process, ensuring that the peeling energy applied does not exceed the critical strength of the die to reduce the risk of cracking the die, in particular when the die is thin and therefore less rigid. Moreover, incorporating the feedback system in a die detachment tool achieves an optimal time for automatic die detachment through active feedback control.

The invention described herein is susceptible to variations, modifications and/or additions other than those specifically described and it is to be understood that the invention includes all such variations, modifications and/or additions which fall within the spirit and scope of the above description.

The invention claimed is:

1. Method for detaching a die from an adhesive tape on which the die is mounted, comprising the steps of:
   supporting with a support surface inner and outer portions of a first side of the die which is in contact with the adhesive tape;
   contacting the inner and outer portions of a second side of the die opposite to the first side with a collet;
   withdrawing support from the outer portion of the die such that the outer portion of the second side of the die bends away from contact with the collet while the support surface only supports the inner portion of the die;
   applying vacuum suction from the collet to attract the outer portion of the die towards the collet and monitoring the vacuum suction pressure until a threshold pressure is reached indicating that the outer portion of the die is contacting the collet; and thereafter
   lifting the collet while the collet is holding the die with vacuum suction to completely separate the die from the adhesive tape.

2. Method as claimed in claim 1, further comprising the step of applying vacuum suction to the adhesive tape from the first side of the die to pull the adhesive tape in a direction away from the collet.

3. Method as claimed in claim 1, wherein the support surface comprises a center plate and at least one pair of outer plates located on opposite sides of the center plate which are arranged adjacent to one another to form a continuous surface to support the die.

4. Method as claimed in claim 3, wherein the support surface comprises at least two pairs of outer plates, and the step of withdrawing support from the outer portion of the die further comprises the step of sequentially lowering each pair of outer plates relative to the center plate from an outermost pair of plates towards the center plate one pair at a time.

5. Method as claimed in claim 4, further comprising the step of providing closed-loop feedback control to ensure that the threshold pressure is reached before lowering a next adjacent pair of outer plates relative to the center plate.

6. Method as claimed in claim 5, further comprising the step of providing a delay time before detecting whether the threshold pressure is reached to allow time for detachment of the die from the adhesive tape.

7. Method as claimed in claim 5, wherein the closed-loop feedback control is provided using a vacuum generator which includes a vacuum detection device.

8. Method as claimed in claim 4, wherein each pair of outer plates is independently movable towards or away from the die by incremental sub-intervals towards a pre-peeling level at which the first side of the die is supported during die detachment.

9. Method as claimed in claim 1, wherein the support surface initially supports a whole of the first side of the die except for a cantilever gap extending along the first side of the die that is unsupported, the cantilever gap being a distance between an edge of the die and a corresponding edge of the support surface.

10. Method as claimed in claim 9, wherein the cantilever gap is in a range of 0.3 mm to 0.8 mm.

11. Method as claimed in claim 1, wherein the die has a thickness of equal to or less than 75 microns.

12. Method as claimed in claim 1, wherein vacuum suction holes are provided on an outer portion of the collet near its edges for monitoring contact between the outer portion of the die and the outer portion of the collet.

13. Method for detaching a die from an adhesive tape on which the die is mounted, comprising the steps of:
   supporting with a support surface inner and outer portions of a first side of the die which is in contact with the adhesive tape;
   contacting the inner and outer portions of a second side of the die opposite to the first side with a collet;
   withdrawing support from the outer portion of the die by lowering an outer portion of the support surface such that the outer portion of the second side of the die bends away from the collet while an inner portion of the support surface supports the inner portion of the die;
   applying vacuum suction from the collet to attract the outer portion of the die towards the collet and monitoring the vacuum suction pressure until a threshold pressure is reached indicating that the outer portion of the die is contacting the collet; and thereafter
   lifting the collet while the collet is holding the die with vacuum suction to completely separate the die from the adhesive tape.

* * * * *